United States Patent
Vekeman et al.

(10) Patent No.: US 7,754,506 B2
(45) Date of Patent: Jul. 13, 2010

(54) METHOD OF FABRICATING SUBMICRON SUSPENDED OBJECTS AND APPLICATION TO THE MECHANICAL CHARACTERIZATION OF SAID OBJECTS

(75) Inventors: Pierre Vekeman, Boissise le Roi (FR); Sodonie Lefebvre, Chatenay Malabry (FR); Thierry Hoc, L'Hay les Roses (FR); Pascal Deconinck, Dresden (DE)

(73) Assignee: Altis Semiconductor (FR)

( * ) Notice: Subject to any disclaimer, the term of this patent is extended or adjusted under 35 U.S.C. 154(b) by 264 days.

(21) Appl. No.: 11/454,151

(22) Filed: Jun. 15, 2006

(65) Prior Publication Data
US 2007/0031984 A1 Feb. 8, 2007

(30) Foreign Application Priority Data
Jun. 15, 2005 (FR) .................................. 05 51622

(51) Int. Cl.
*H01L 21/00* (2006.01)
(52) U.S. Cl. ....................................................... 438/24
(58) Field of Classification Search ....................... None
See application file for complete search history.

(56) References Cited
U.S. PATENT DOCUMENTS
5,876,881 A * 3/1999 Kawata .......................... 430/5
2004/0126921 A1 7/2004 Volant et al. .................. 438/52
2005/0067633 A1 3/2005 Mushika ....................... 257/202
2007/0031984 A1 * 2/2007 Vekeman et al. ............... 438/24

FOREIGN PATENT DOCUMENTS
EP 0922944 4/1998

OTHER PUBLICATIONS
French Search Report- Sep. 19, 2005.
Simultaneous Fabrication of RF MEMS Switches and Resonators Using Copper-Based CMOS Interconnect Manufacturing Methods- pp. 789-792- Jan. 25, 2004.
Comparison of the Young's modulus of polysilicon film by tensile testing and nanoindentation- pp. 151-158- Jan. 3, 2005.
Design Fabrication of RF MEMS Capacitive Switch on Silicon Substrate with Advanced IC Interconnect Technology- pp. 739-741- Oct. 22, 2001.

* cited by examiner

*Primary Examiner*—Charles D Garber
*Assistant Examiner*—Andre' C Stevenson
(74) *Attorney, Agent, or Firm*—Sofer & Haroun, LLP

(57) ABSTRACT

A method of fabricating submicron objects that includes the following steps: depositing a void layer on a support, depositing a transfer layer on the void layer, producing the objects in the transfer layer, producing a hard mask on a portion of the transfer layer to delimit a region comprising a portion of the objects, and etching the combination formed by the hard mask, the transfer layer and the void layer to eliminate the hard mask and the portion of the transfer layer in the region and to open up the portion of the void layer under the region so that the objects are suspended, the rate of etching the void layer being greater than the rate of etching the transfer layer and the hard mask.

22 Claims, 7 Drawing Sheets

METHOD OF FABRICATING SUBMICRON SUSPENDED OBJECTS AND APPLICATION TO THE MECHANICAL CHARACTERIZATION OF SAID OBJECTS

RELATED APPLICATIONS

This application is related to and claims the benefit of priority from French Patent Application No. 05 51622, filed on Jun. 15, 2006, the entirety of which is incorporated herein by reference.

BACKGROUND OF THE INVENTION

1. Field of the Invention

The present invention consists in a method of fabricating submicron suspended objects and in microelectronic components fabricated by the method. The invention also relates to determining at least one property of the objects or the materials constituting them.

2. Description of the Prior Art

In the field of microelectronics, increasingly smaller microcircuits are used. Apart from reducing their overall size, miniaturization reduces the electrical power consumption and increases the speed of the circuits. The technologies currently used in microelectronics produce microcircuit elements such as component connections with submicron dimensions. In the present application, the expressions "submicron object" and "nanometer object" refer to objects having dimensions less than a few microns (micrometers (μm)), generally of the order of a few hundred nanometers (for example from 50 to 300 nanometers), except for one dimension (generally their length) which can exceed a few microns, although this is not necessarily the case. For example, a submicron object of rectangular parallelepiped shape will have a width and a height generally less than 1 μm, of the order of a few hundred nanometers, and a length that can exceed a few microns, while an object of cylindrical shape will have a cross section diameter less than 1 μm, for example a few hundred nanometers, and a length that may exceed several microns.

Because of their small size, these submicron objects are produced on a support, generally a semiconductor, or on an insulative layer, for example a layer of silicon nitride or oxide, itself deposited on a support. Although their electrical properties can be determined relatively easily, until now it has not been possible to determine mechanical properties of these objects or the materials constituting them in a satisfactory manner. For example, the method described by Michael D. Uchic, Dennis M. Dimiduk, Jeffrey N. Florando and William D. Dix in their paper "Sample dimensions influence strength and crystal plasticity" published Aug. 13, 2004 in Science, Vol. 305, pages 986-989, consists in using a focused ion beam (FIB) to cut a submicron cylinder having a diameter from 100 to 200 nm in a thin layer of material whose mechanical properties are to be determined. An indentation point is pressed onto the top of the cylinder and the displacement of the point as a function of the applied force is measured. This technique has the drawback that it does not really represent the characteristics of the material on the submicron scale since the cylinder tested has not been fabricated with submicron dimensions but cut from a layer of much greater size, for example of the order of 1 cm. At submicron dimensions, new physical phenomena arise that do not exist on a larger scale. This results in different mechanical properties. It is important to characterize submicron objects mechanically and electrically in order to adjust their fabrication methods, for example the composition of the material or materials from which the objects are fabricated, the interfacing of the components or the methods of cleaning and annealing the components. Knowing the mechanical properties of submicron objects enables the design of microelectronic methods of fabricating the objects, such as microchips and other microelectronic components, and improves the reliability of those components and microcircuits.

The present invention offers a solution to the above problem by proposing a method of fabricating submicron suspended objects. The characterization of the mechanical and electrical properties of the objects is a true representation of their properties on the submicron scale because the objects are fabricated at that scale and no longer rest at least in part on a support. The electrical insulation of the objects is perfect as they are surrounded by air.

SUMMARY OF THE INVENTION

To be more precise, the present invention proposes a method of fabricating submicron objects, including the following steps:
depositing a void layer on a support,
depositing a transfer layer on the void layer,
producing the objects in the transfer layer,
producing a hard mask on a portion of the transfer layer to delimit a region comprising a portion of the objects, and
etching the combination formed by the hard mask, the transfer layer and the void layer to eliminate the hard mask and the portion of the transfer layer in the region and to open up the portion of the void layer under the region so that the objects are suspended, the rate of etching the void layer being greater than the rate of etching the transfer layer and the hard mask.

The rate of etching the void layer is advantageously an order of magnitude greater than the rate of etching the transfer layer and the hard mask.

In an advantageous embodiment:
the void layer is a layer of silicon oxide doped with boron or phosphorus and its thickness is greater than 1 μm, preferably of the order of 3 μm;
the transfer layer is a layer of silicon oxide or silicon nitride;
the objects have a metal structure and the production of the objects in the transfer layer includes etching the transfer layer according to the shape of the objects, depositing a metal layer on the etched transfer layer, and polishing the metal layer; and
the hard mask is produced over a portion of the transfer layer by depositing a layer of silicon nitride or silicon oxide on the transfer layer in which the objects have been formed and depositing a layer of resin on the nitride layer outside the region, the resin layer delimiting the region.

In another embodiment, an attachment layer may be deposited on the etched transfer layer before depositing the metal layer, for example a layer of tantalum or titanium.

In one particular embodiment, the objects form a set of substantially parallel metal beams suspended at one of their ends at least. The beams are in the region and the suspension of the beams is outside the region.

The support of the void layer is advantageously a semiconductor.

The present invention also relates to microelectronic components fabricated by the above method having at least one submicron suspended portion.

The present invention also proposes an application of the above method to the characterization, in particular the mechanical characterization, of submicron metal objects or the material constituting the submicron objects. To this end, at least one submicron beam suspended at one or both ends is fabricated by the method and tests are effected on the beam in order to characterize at least one mechanical property of the beam or the material constituting it. The mechanical property may be the Young's modulus or the elastic limit, for example. Mechanical characterization is advantageously effected by a nano-indentation technique.

Of course, it is possible to determine the electrical properties of the submicron objects which, being suspended and therefore partly surrounded by air, have electrical characteristics that may be different from those of identical objects resting on an insulative support.

Other advantages and features of the invention will become apparent in the course of the following description of embodiments of the invention given by way of nonlimiting example and with reference to the appended drawings.

DETAILED DESCRIPTION OF PREFERRED EMBODIMENTS

The method to be described relates to the fabrication of a set of submicron suspended objects, to be more precise a set of parallel beams built in at both ends.

Figure 1:
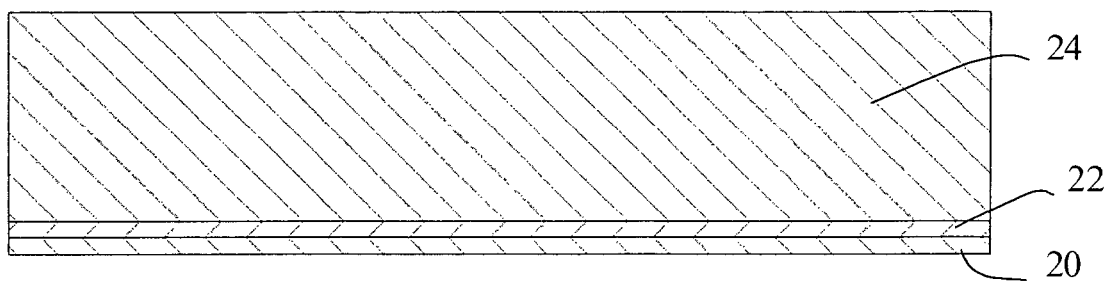
FIGS. 1 to 12 show steps of a method of fabricating submicron suspended objects.

As shown in FIG. 1, the starting point is a support 20 consisting of a silicon wafer of standard 200 or 300 mm diameter. The wafer may be cleaned first by a conventional method. An intermediate film 22 consisting of a layer of silicon nitride approximately 50 to 100 nm thick is advantageously (although not necessarily) deposited on the wafer 20 to increase the stiffness of the wafer and thereby to reduce the risk of mechanical stresses caused by depositing the next layer.

A void layer 24 is then deposited on the layer 22. The void layer is relatively thick, having a thickness exceeding 1 μm and preferably close to 2 or 3 μm. This thickness is adjusted as a function in particular of the thickness of the beams to be produced and the rate of etching the void layer. As indicated hereinafter, the material of this layer is selected so that when it is etched, for example using a standard litho-etching process, the rate of etching is greater than that of the other materials used in the execution of the process (preferably by an order of magnitude, and therefore substantially ten times faster). In other words, during an etching operation, the quantity of material eliminated from the void layer is greater than the quantity of material eliminated in other layers. The void layer 24 is preferably made of silicon oxide doped with boron or any other dopant (for example phosphorus) with the particular feature of increasing the rate of etching the material.

Figure 2:
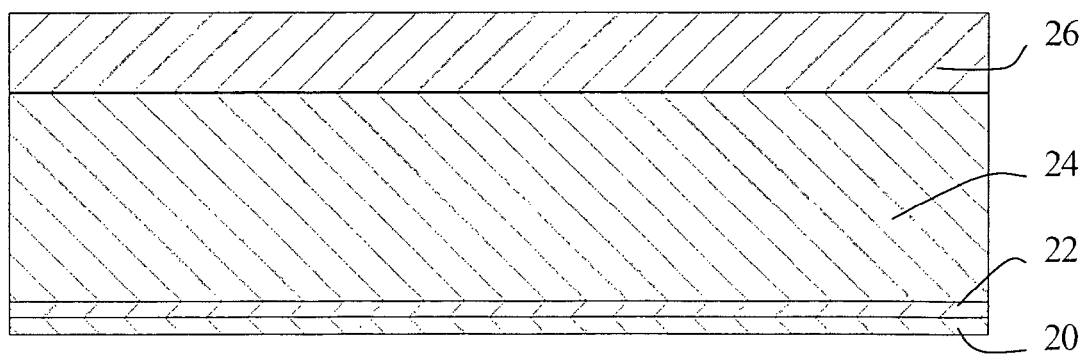
Figure 3:
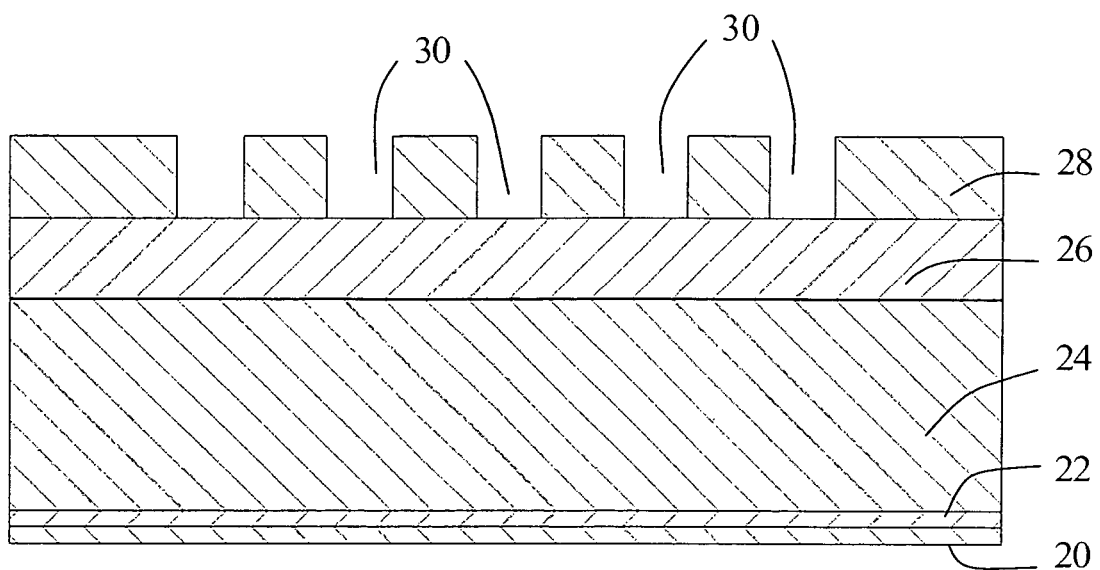
Figure 4:
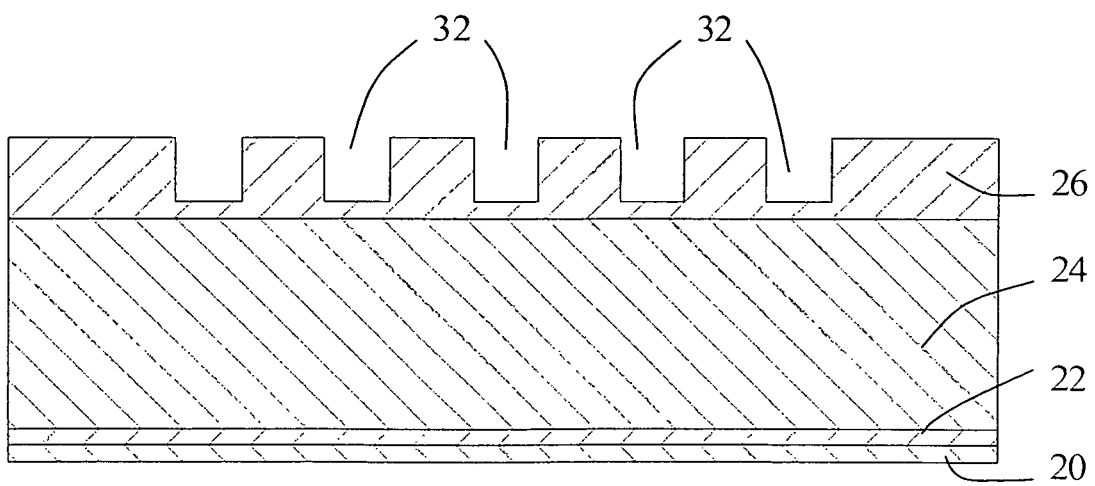

A silicon oxide or silicon nitride transfer layer 26 around 400 nm thick is then deposited on the void layer 24 (FIG. 2). Objects are then produced in this transfer layer 26. To this end, a resin mask 28 is deposited on the transfer layer 26 (FIG. 3). The mask includes holes 30 that espouse the shape of the objects to be fabricated. Using a standard lithographic process (FIG. 4), the transfer layer 26 is etched to reproduce the shape of the mask in the transfer layer 26, and the resin layer 28 is eliminated. For the fabrication of parallel beams, the recesses 32 form an array of parallel grooves of substantially rectangular parallelepiped shape. The width of the grooves corresponds to the required width of the beams. A short wavelength (for example 248 nm) ultraviolet lithographic process is preferably used in order to obtain sufficient accuracy in respect of the dimensions of the beams. Those dimensions may be approximately as follows, for example: width 200 nm, thickness 400 nm, and length approximately 6 μm.

Figure 5:
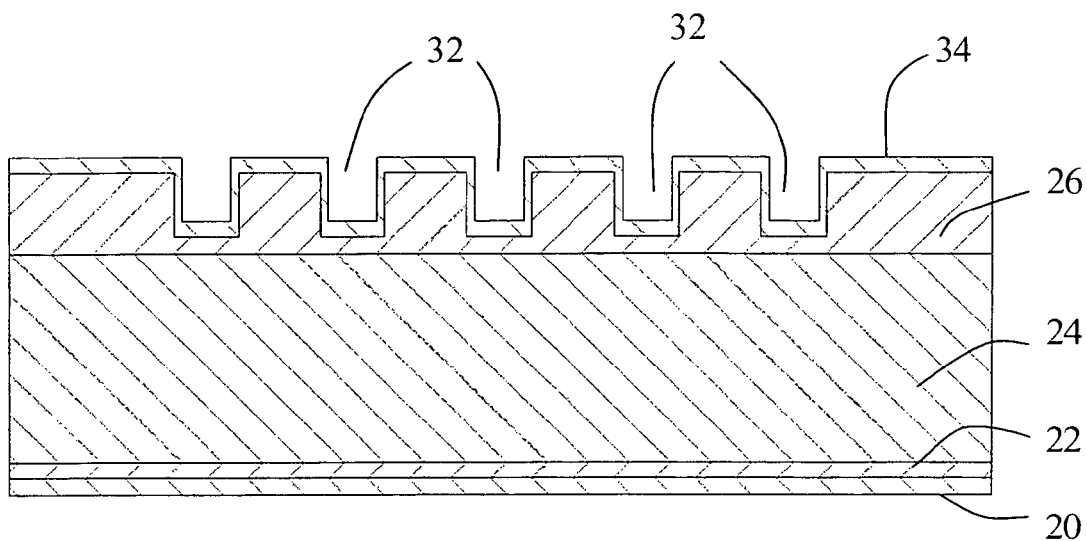

An attachment layer 34 is then advantageously (but not necessarily) deposited on the etched transfer layer 26 (FIG. 5). Its presence enables submicron objects to be produced in a wide range of different materials, in particular in practically any type of metal. The material used for the attachment layer 34 depends on the material of the objects to be produced. For example, it may be tantalum if the objects are of copper or titanium if the objects are of tungsten. The attachment layer 34 is very thin compared to the thickness of the objects (for example, a few tens of nanometers compared to a few hundred nanometers).

Figure 6:
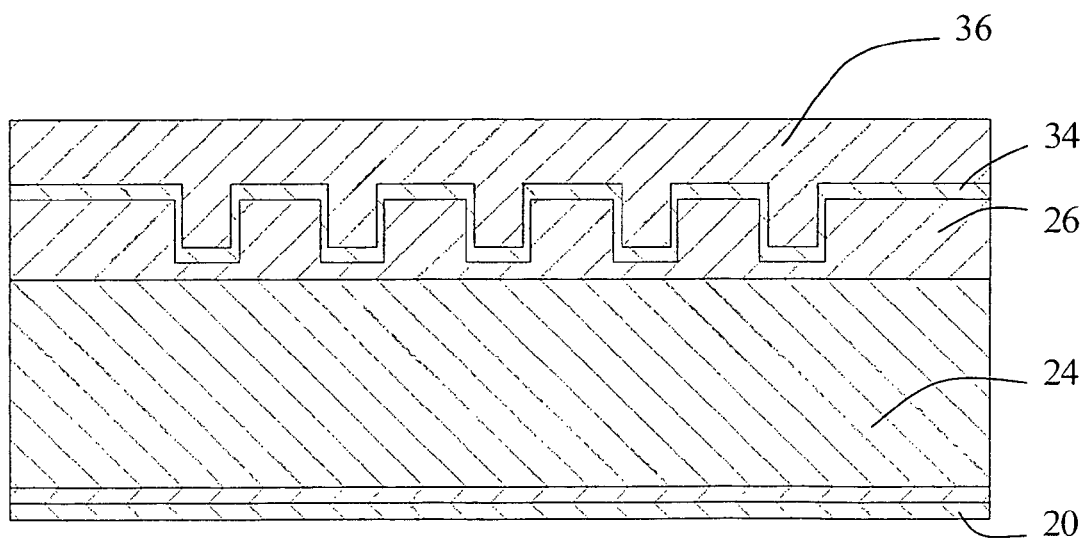

A layer 36 of the material constituting the submicron objects is deposited on the etched transfer layer to fill the grooves 32 completely (FIG. 6). To investigate the characteristics of submicron copper interconnections of microcircuits, the material of the layer 36 is copper. The deposition may be effected by a standard method, for example plasma vapor deposition (PVD), chemical vapor deposition (CVD) or electrochemical deposition (ECD). In the case of copper, deposition may be effected electrochemically, for example in a bath of electrolyte based on sulfuric acid. Generally speaking, the layer 36 is made from a material from which submicron objects are to be produced, for example a metal or an insulative material if metal or insulative submicron objects are required, respectively.

Figure 7:
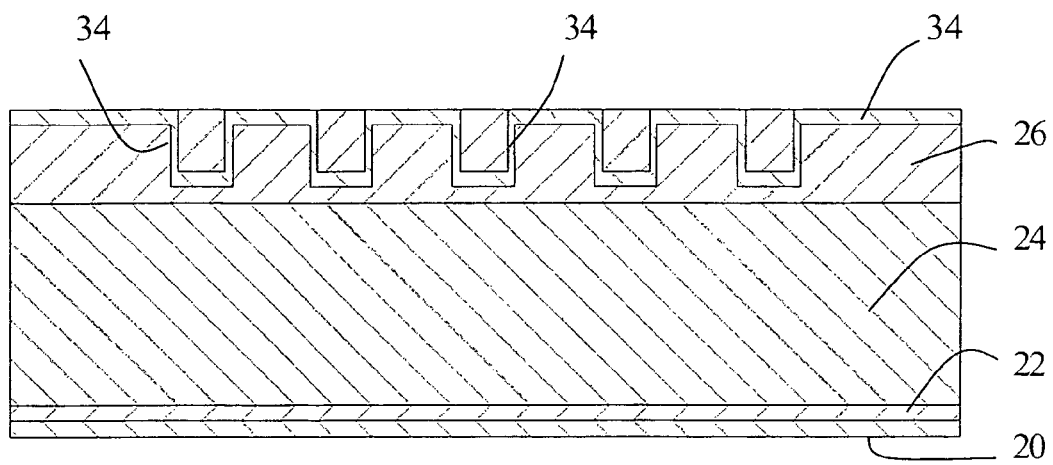
Figure 8:
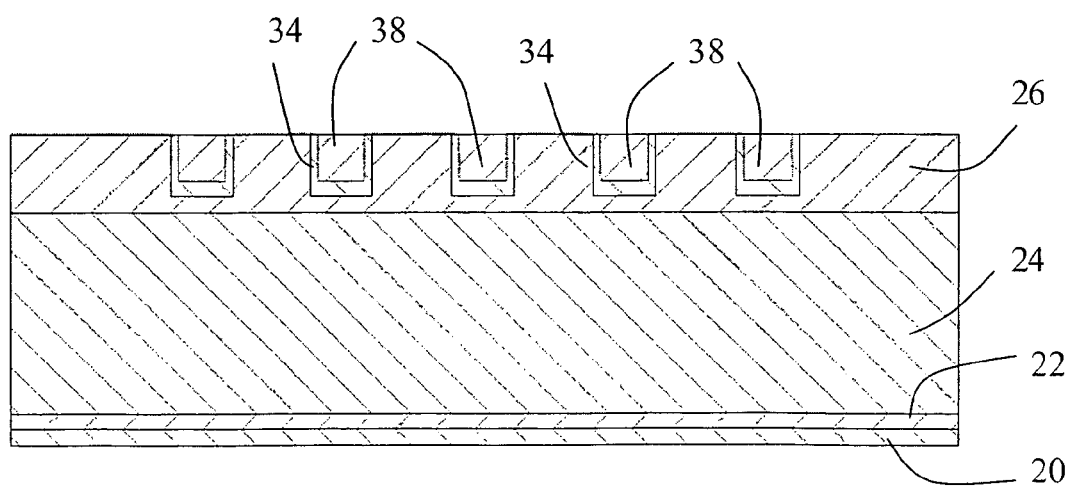
Figure 9:
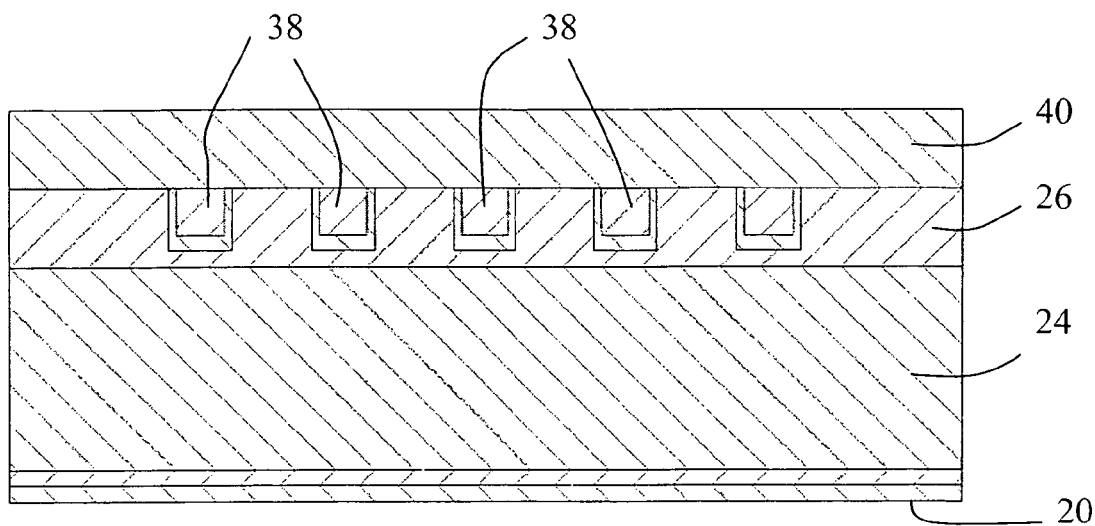
Figure 10:
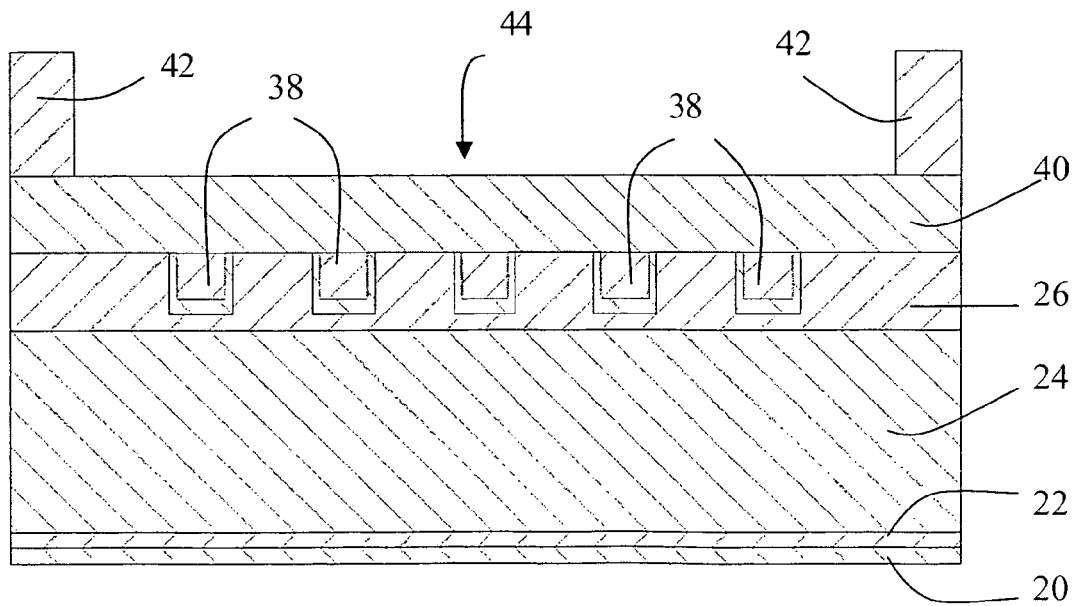

This is followed by polishing (FIG. 7) to remove surplus material deposited in the preceding step. If an attachment layer 34 is used, the removal of the material by the standard polishing processes stops at the attachment layer 34, which is then removed by a new polishing operation (FIG. 8), except for the attachment layer portions covering the walls of the grooves 32. If an attachment layer is not used, the polishing operation is stopped at the transfer layer 26. The surplus material and the attachment layer may be removed by etching instead of polishing. This produces the submicron objects, to be more precise the beams 38. However, at this stage the objects 38 are not suspended. Suspending the objects is the aim of subsequent steps of the method.

Figure 11:
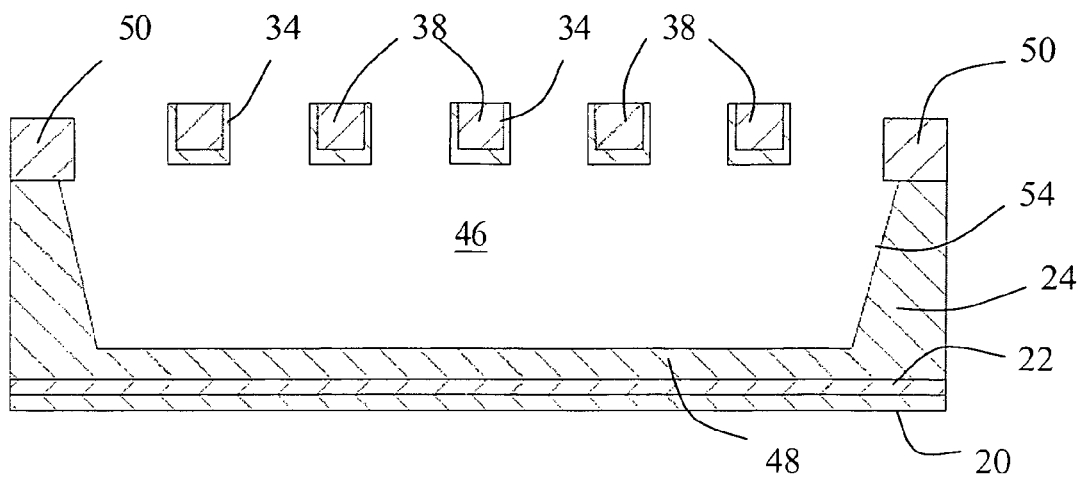

A hard mask is produced on top of the transfer layer 26. This mask consists on the one hand of a layer 40, preferably of silicon nitride or silicon oxide, deposited on the transfer layer 26 and on the objects 38 and on the other hand of a deposit of resin 42 on top of portions of the transfer layer 26 that are to be preserved during the subsequent etching operation and on top of the portions of the objects that continue to be supported by the transfer layer 26 after said etching operation. In other words, the portion of the layer 40 not covered with resin 42 delimits an area 44 on top of the suspended part of the objects 38. An image of the cavity 46 is formed in the next step by litho-etching (FIG. 11). Ultraviolet light of moderate wavelength (for example 365 nm) can be used for this litho-etching because cavities of the order of 10 μm are produced so that the accuracy required in the process step shown in FIG. 3 is not needed at this stage.

Figure 12:
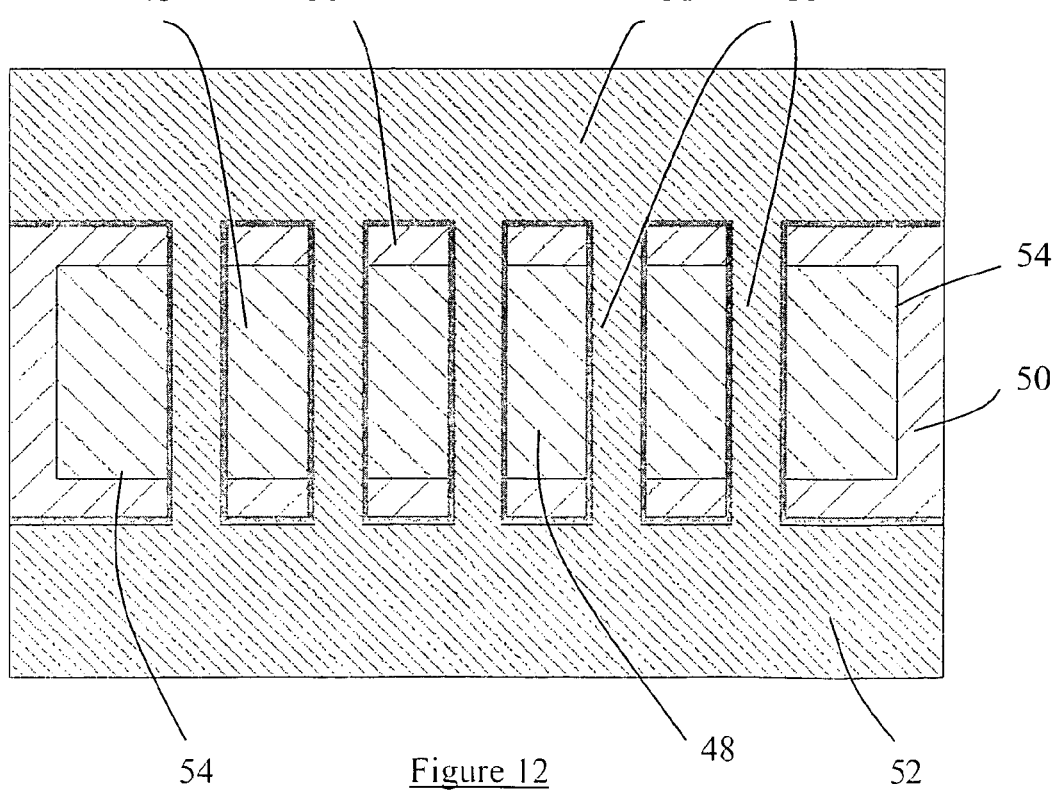

The portion of the void layer 24 under the area 44 is then opened up by exposing the combination of the layers 22, 24, 26, 40 and 42 and the objects 38 to a combination of wet and dry etching (FIGS. 11 and 12). Dry etching has the feature that the direction of etching can be controlled. It can be used for anisotropic or isotropic etching. Anisotropic etching is used only for etching in the vertical direction only, whereas isotropic etching is used for etching in all directions, in particular in the depthwise direction and laterally. The production of the void under the objects is finalized by isotropic wet etching. It is therefore a combination of two types of etching that opens up the cavity and suspends the object.

The aim is to produce a cavity 46 in order to obtain a set of beams suspended at both ends. The cavity must be sufficiently large to provide good mechanical and electrical isolation of the suspended portions of the objects from the remaining portion 48 of the void layer and to leave no residue in the cavity. The hard mask made up of the layers 40 and 42 and the transfer layer 26 disappear except for the remaining portions of the transfer layer 26 (the portions 50 thereof under the resin 42). These remaining portions 50 support the unsuspended portion 52 of the objects 38 and must therefore not be damaged by the etching step. Etching is stopped when a thin residue of the void layer 48 remains at the bottom of the cavity 46, so the etching does not attack the intermediate film 22 (or the support 20 if there is no intermediate film). The edges 54 of the void layer must also be preserved.

To form the cavity 46 at the same time as eliminating the hard mask made up of the layers 40 and 42 and the transport layer 26 (with the exception of the remaining portions 50), the rate of etching the void layer 24 must be greater than the rate of etching the layers 26, 40 and 42, and the objects 38 must be protected. The objects are protected naturally by the choice of the etching process, which etches the cited layers and not the objects. For example, there is an order of magnitude difference in the etching rate. In other words, the rate of etching the void layer 24 is approximately ten times greater than the rate of etching the layers 26, 40 and 42. There is therefore a delay in etching those layers relative to etching the void layer. The difference between the etching rates is determined as a function of the materials used for the layers, the thickness of the layers and the required height of the cavity 46.

The suspended portion of the objects may be protected from corrosion by injecting an anticorrosion product into the cavity 46 at the end of the etching step.

For example, the etching operation may be effected in the following manner, beginning with a two-stage dry plasma etching process.

The first step anisotropically etches the nitride layer 40 using a fluorinated composition, for example $CHF_3$.

Said first step etches the layer 40 vertically through the mask of resin 42 in the area 44, said resin 42 being developed by a photolithographic process, then the layer 26 under the layer 40 and then the layer 24 under the layer 26, to the depth required in the cavity 46 such that the layers 22 and 20 are not attacked.

This step preserves the portions of the layers 40, 26 and 24 vertically under the layer 42.

A second step uses isotropic etching to etch in depth and laterally the layer 42, the layer 40 under the layer 42, and in particular the layers 24 and 26 under the objects 38.

Said second step can be implemented with a mixture of fluorinated gases, for example a mixture of $CHF_3$ and $C_2F_6$.

This additional isotropic etching step must be short to preserve the remaining portions 50 of the layer 26 that support the unsuspended portion 52 of the objects 38. Said additional step terminates the removal of the oxides that were not etched by the plasma, in particular under the large objects 38. A chemical based on hydrofluoric acid (HF) is used for this, preferably diluted in ammonium fluoride ($NH_4OH$). The dilution must be sufficient to obtain a high but not excessively high etching rate. The BE 7:1 buffered etchant has proved a good compromise. The dilution can nevertheless be slightly higher. In the case of objects 38 sensitive to corrosion, a chemical may injected at the end of the process to protect them. In the case of copper objects, benzothiazole (BTA) may be injected.

Figure 13:
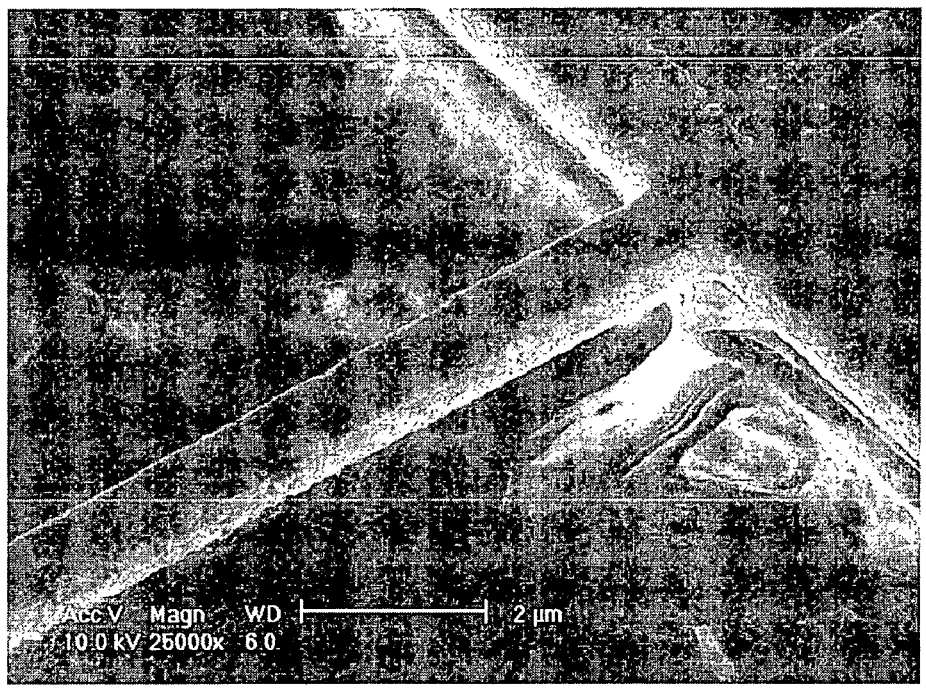
FIG. 13 shows in detail in portion of one of the objects fabricated by the method shown in the preceding figures.

FIG. 13 is an electron microscope photograph of a portion of a suspended beam. The suspended portion and its anchor point can clearly be distinguished. The width of the beam in the photograph is approximately 200 nm and its thickness is approximately 400 nm.

The embodiment that has just been described relates to the simultaneous production of a set of beams suspended at both ends. Clearly the beams could be built in at only one end, merely by adjusting the geometry of the hard mask consisting of the layer 40 and the resin 42. Similarly, a single beam could be produced.

Different shapes of submicron objects can easily be conceived. It suffices for this to adapt the mask of the layer 28 (FIG. 3) to the required shape. For example, the FIG. 14 photograph shows one particular suspended structure that has a square void at the center and is suspended by three arms with submicron dimensions, except for their length, themselves suspended from a support. This structure is suitable for tension tests, for example.

Thus the present invention also consists in any type of microelectronic component comprising a suspended submicron part and fabricated by the method described above.

The method of the invention is beneficial not only for fabricating submicrons suspended objects but also for determining the mechanical and electrical characteristics of those objects and the materials constituting them. The fact that the objects are suspended enables testing of certain of their mechanical properties that are not accessible without the present invention, for example their Young's modulus and their elasticity (in particular their elastic limit). Moreover, the suspended objects are at least in part electrically insulated by the air that surrounds them. Air is a better electrical insulator than the standard insulators (silicon oxide or silicon nitride) on which these objects usually rest: their electrical properties should therefore be different. For example, if the submicron object is a suspended beam built in at both ends, which may in reality be a copper interconnection between two components of a microelectronic circuit, the invention enables testing on this submicroscopic scale of the mechanical properties of the interconnection and therefore of the mechanical properties of the copper. The invention also provides access to the electrical properties at the submicron level of this kind of interconnection and therefore of the copper.

The mechanical and electrical properties are determined by standard methods used in microelectronics. For example, to measure Young's modulus and elasticity, one or more beams suspended at both ends are fabricated. A nano-indentation point is deposited at the center of the beam. The point bears on the beam and its displacement as a function of the applied force is measured. The applied force at which the beam ruptures may also be measured. The elastic limit may also be determined, which corresponds to the moment at which the material under stress no longer reverts to its original shape and remains deformed.

Figure 14:
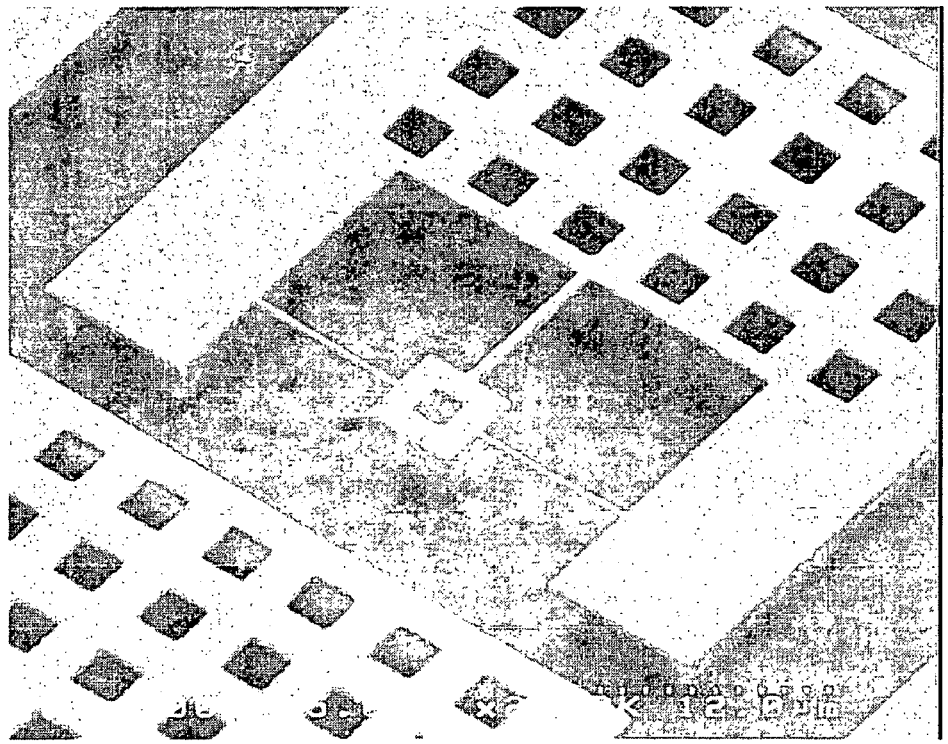
FIG. 14 shows another example of a suspended submicron object fabricated by the method of the invention.

The embodiment shown in FIG. 14 is used, for example, to determine the mechanical properties of a component suspended by submicron arms by applying tension tests to the component and bending tests to the arms.

The invention opens up new fields in microelectronics since it enables the production of new microelectronic structures, for example capacitive structures or two facing submicron metal wires insulated by air only. Starting from these submicron suspended objects such as beams, for example, it is easy to envisage Microsystems such as sensors for measuring acceleration, pressure, vibration or temperature, for example.

There is claimed:

1. A method of fabricating submicron objects, including the following steps:
   depositing a void layer on a support wafer,
   depositing a transfer layer on said void layer,
   producing said objects in said transfer layer,
   producing a hard mask on a portion of said transfer layer to delimit a region comprising a portion of said objects, and
   etching the combination formed by said hard mask, said transfer layer and said void layer to eliminate said hard mask and the portion of said transfer layer in said region and to open up the portion of said void layer under said region so that said objects are suspended, and so that said etching does not attack the support wafer,
   the rate of etching said void layer being greater than the rate of etching said transfer layer and said hard mask.

2. The method claimed in claim 1 wherein said rate of etching said void layer is an order of magnitude greater than the rate of etching said transfer layer and said hard mask.

3. The method claimed in claim 1 wherein said void layer is a layer of silicon oxide doped with a material for increasing the rate of etching said void layer.

4. The method claimed in claim 3 wherein said void layer is doped with boron or phosphorus.

5. The method claimed in claim 1 wherein the thickness of said void layer is greater than 1 µm.

6. The method claimed in claim 1 wherein said objects have a metal structure and said production of said objects in said transfer layer includes the following steps:
   etching said transfer layer according to the shape of said objects,
   depositing a metal layer on the etched transfer layer, and polishing said metal layer.

7. The method claimed in claim 6 wherein said etching of said transfer layer is effected by litho-etching.

8. The method claimed in claim 1 wherein said transfer layer is a layer of silicon oxide or silicon nitride.

9. The method claimed in claim 6 wherein an attachment layer is deposited on the etched transfer layer before depositing said metal layer.

10. The method claimed in claim 9 wherein said attachment layer is a layer of tantalum or titanium.

11. The method claimed in claim 1 wherein said hard mask is produced over a portion of said transfer layer by depositing a layer of silicon nitride or silicon oxide on said transfer layer in which said objects have been formed and depositing a layer of resin on said nitride layer outside said region, said resin layer delimiting said region.

12. The method claimed in claim 1 wherein said objects form a set of substantially parallel metal beams suspended at one of their ends at least.

13. The method claimed in claim 12 wherein the suspended portion of said beams is in said region and the suspension of said beams is outside said region.

14. The method claimed in claim 1 wherein said support wafer is a semiconductor.

15. The method claimed in claim 1 wherein an intermediate film is deposited between said support wafer and said void layer.

16. The method claimed in claim 15 wherein said etching does not attack the intermediate film.

17. A microelectronic component fabricated by the method claimed in claim 1 and having at least one submicron suspended portion.

18. The application claimed in claim 16 to determine at least one property of a submicron object or the material constituting said submicron object.

19. The application claimed in claim 18 wherein at least one submicron suspended at one or both ends is fabricated by said method and tests are effected on said beam in order to characterize at least one mechanical property of said beam or the material constituting it.

20. The application claimed in claim 19 wherein at least the Young's modulus, the elasticity or the elastic limit is determined.

21. The application claimed in claim 18 wherein said mechanical characterization is effected by nano-indentation technique.

22. A method of fabricating submicron objects, including the following steps:
   depositing a void layer on a support wafer,
   depositing a transfer layer on said void layer,
   producing said objects in said transfer layer,
   producing a hard mask on a portion of said transfer layer by depositing a layer of silicon nitride or silicon oxide on said transfer layer in which said objects have been formed and depositing on said layer outside said region, said resin layer delimiting a region comprising a portion of said objects,
   etching the combination formed by said hard mask, said transfer layer and said void layer to eliminate said hard mask and the portion of said transfer layer in said region and to open up the portion of said void layer under said region so that said objects are suspended, and so that said etching does not attack the support wafer, and
   the rate of etching said void layer being greater than the rate of etching said transfer later and said hard mask.

* * * * *